United States Patent [19]
Goeckler

[11] Patent Number: 5,926,783
[45] Date of Patent: Jul. 20, 1999

[54] SWITCHABLE DIVIDING NETWORK

[75] Inventor: Heinz Goeckler, Backnang, Germany

[73] Assignee: Robert Bosch GmbH, Stuttgart, Germany

[21] Appl. No.: 08/887,209

[22] Filed: Jul. 2, 1997

[30]  Foreign Application Priority Data

Jul. 10, 1996 [DE] Germany .......................... 196 27 788

[51] Int. Cl.[6] .......................... G06F 17/10; G06F 17/14
[52] U.S. Cl. .................................. 702/190; 364/724.011; 364/724.13; 364/724.18; 370/480; 370/481
[58] Field of Search ................................ 702/189, 190; 364/724.011, 724.1, 724.11, 724.13, 724.16, 724.18, 724.2; 370/464, 480, 481, 484; 375/229, 350

[56]  References Cited

U.S. PATENT DOCUMENTS

| | | | |
|---|---|---|---|
| 4,792,943 | 12/1988 | Goeckler | 370/70 |
| 4,839,889 | 6/1989 | Goeckler | 370/70 |
| 4,881,222 | 11/1989 | Goeckler et al. | 370/70 |
| 4,896,320 | 1/1990 | Goeckler | 370/123 |
| 4,953,118 | 8/1990 | Goeckler | 364/724.01 |
| 5,068,817 | 11/1991 | Goeckler | 364/724.16 |
| 5,177,700 | 1/1993 | Goeckler | 364/724.1 |
| 5,229,729 | 7/1993 | Nishikawa et al. | 333/126 |
| 5,461,612 | 10/1995 | Goeckler et al. | 370/55 |
| 5,587,939 | 12/1996 | Soleymani et al. | 364/724.16 |
| 5,642,385 | 6/1997 | Alberty | 375/354 |
| 5,677,932 | 10/1997 | Comte et al. | 375/235 |
| 5,699,363 | 12/1997 | Wishart et al. | 370/497 |
| 5,757,867 | 5/1998 | Caulfield et al. | 375/350 |

*Primary Examiner*—Patrick Assouad
*Attorney, Agent, or Firm*—Michael J. Striker

[57] ABSTRACT

The switchable dividing network includes two individual filters whose center frequencies are selected from the group consisting of $f_a/8$, $3f_a/8$, $5f_a/8$ and $7f_a/8$. The passband of its transmission function is shiftable to other frequency ranges by changing signs of a few coupling devices.

14 Claims, 8 Drawing Sheets

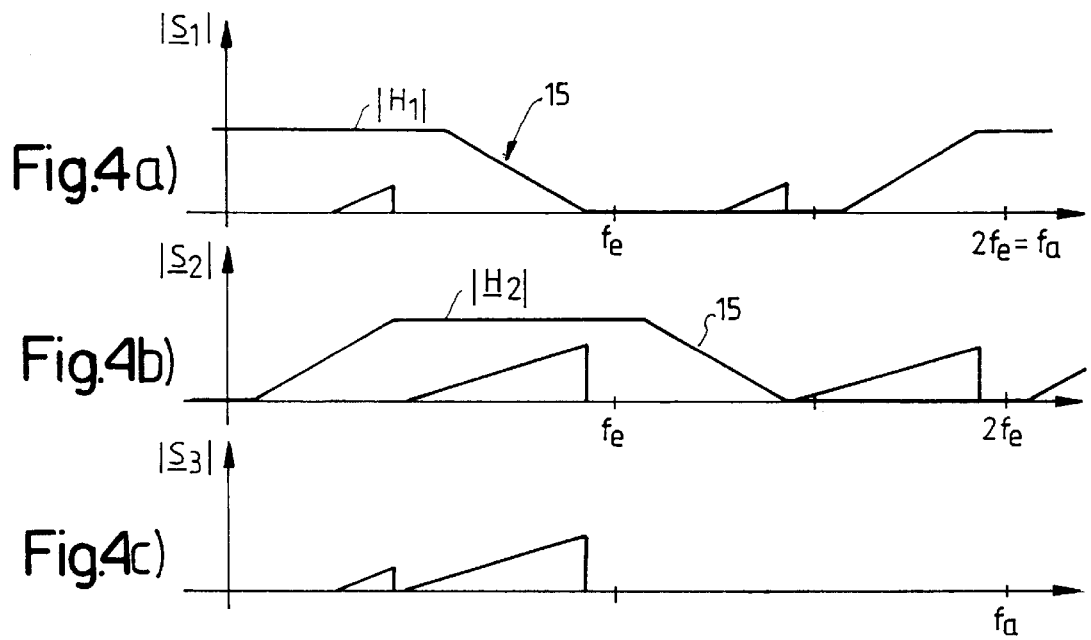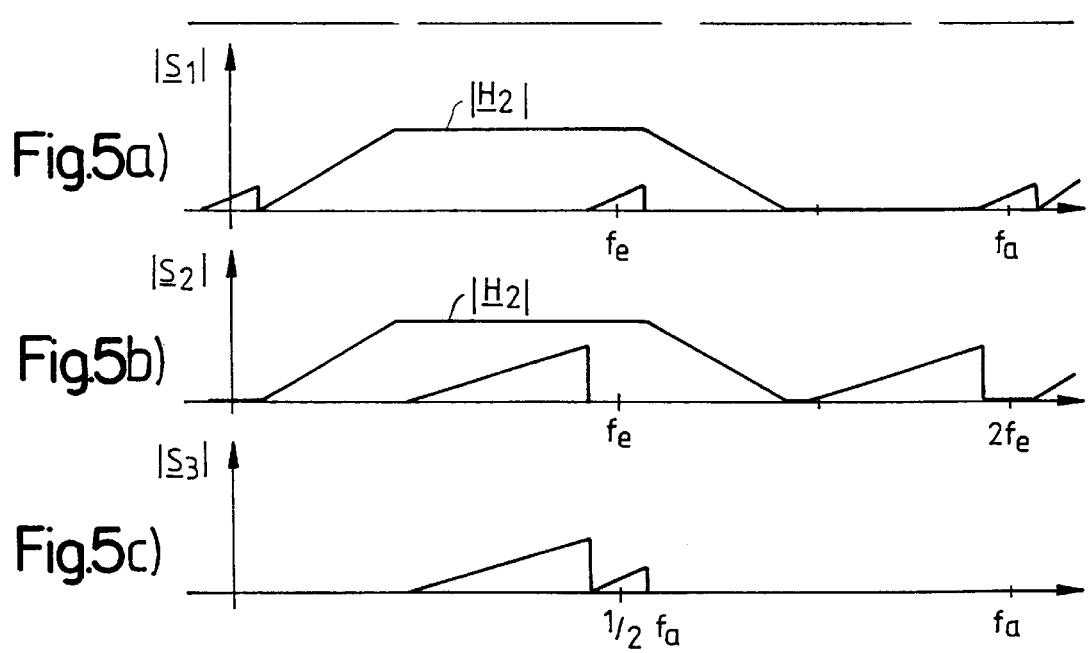

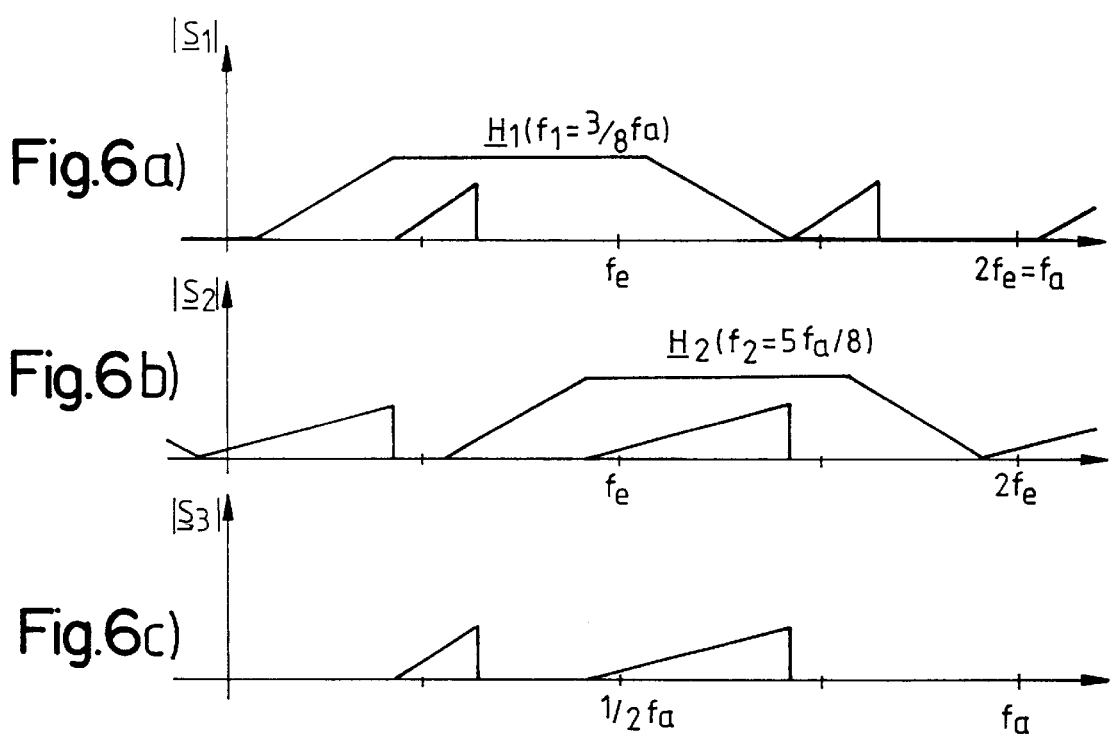

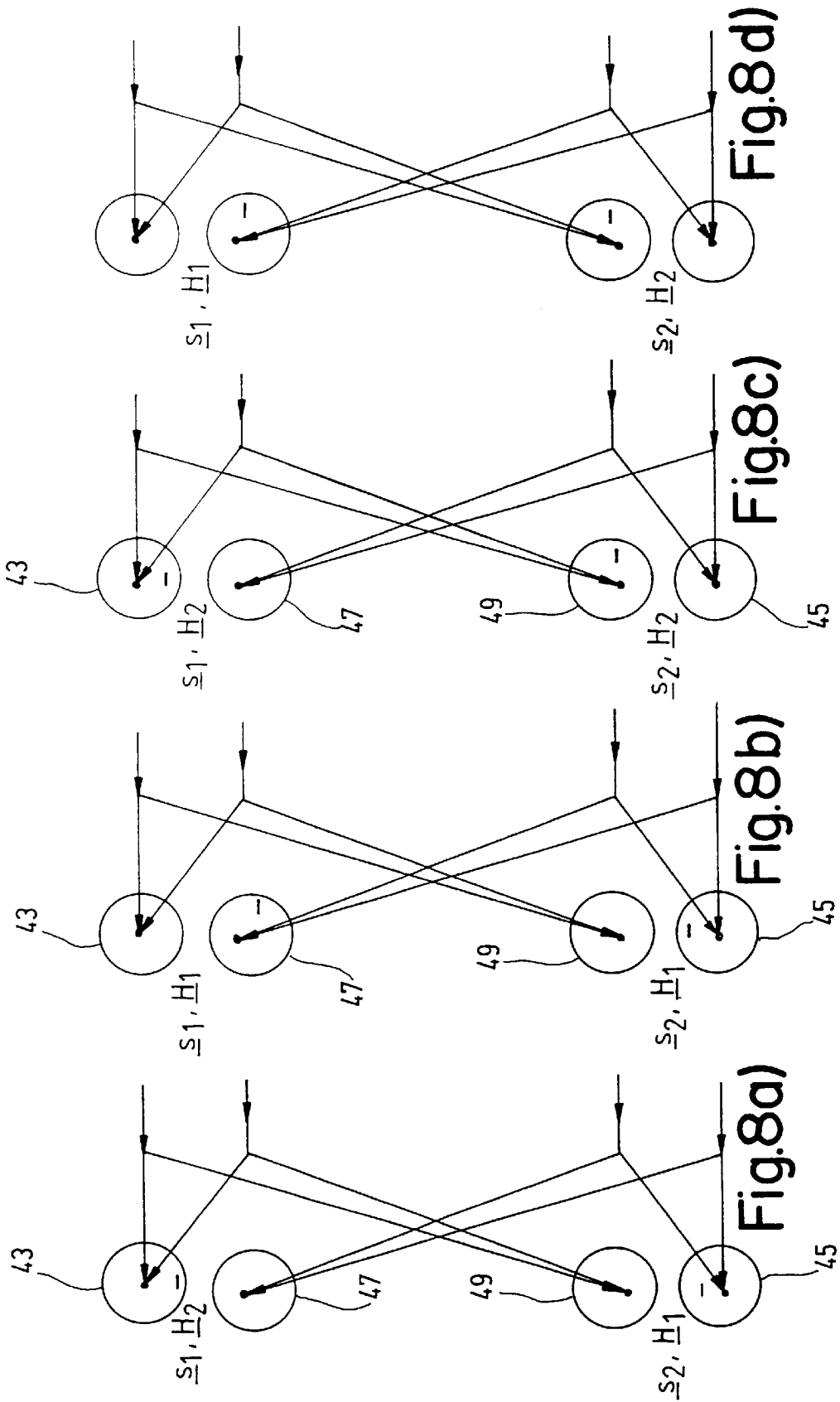

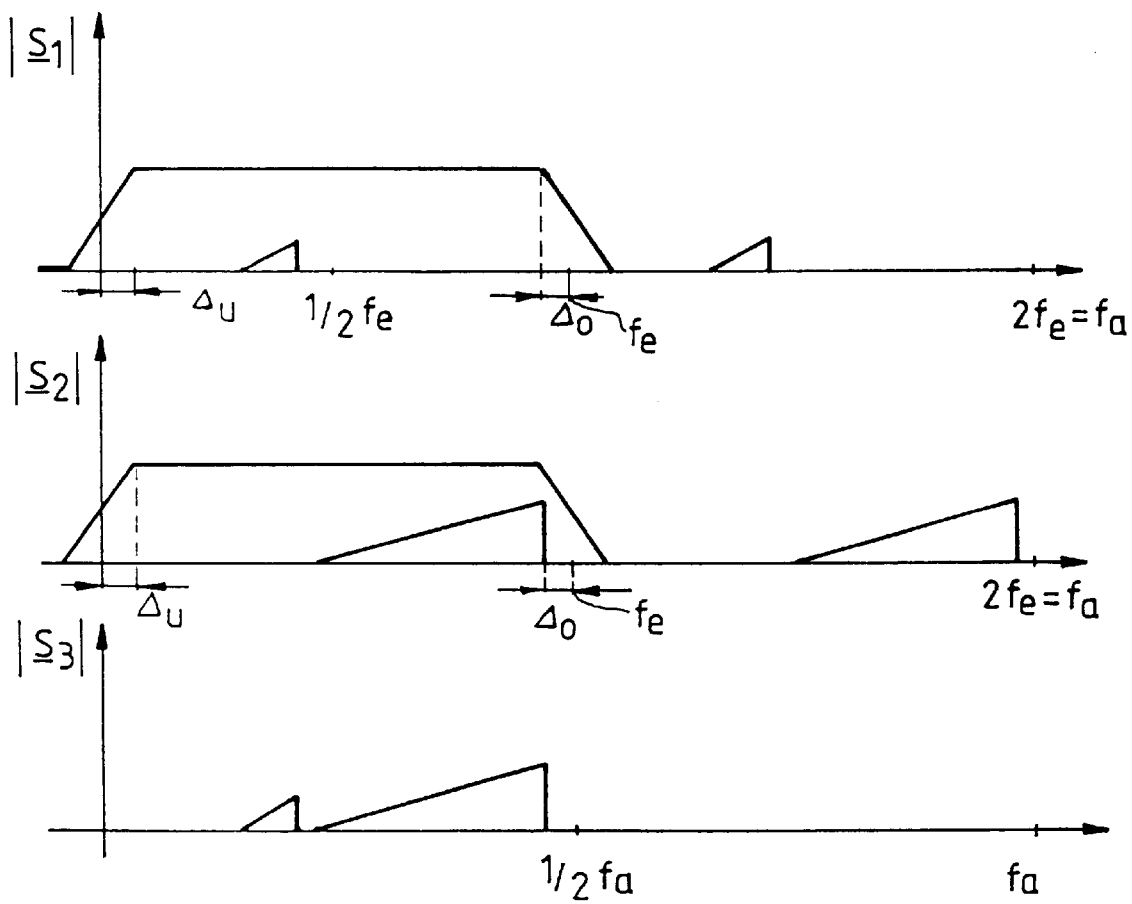
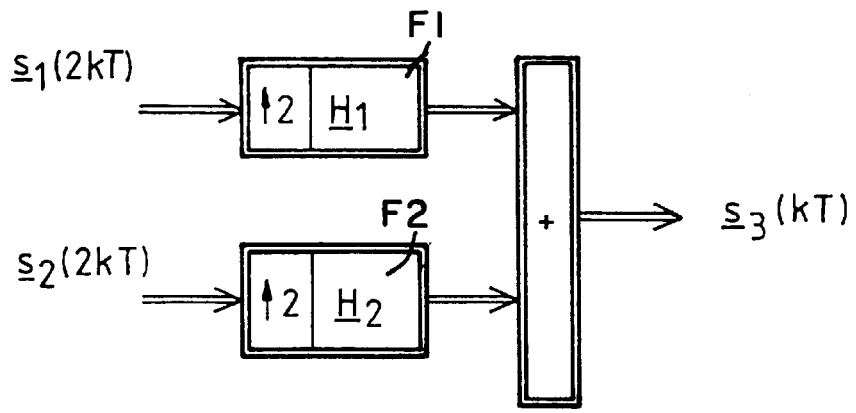
Fig. 10

SWITCHABLE DIVIDING NETWORK

BACKGROUND OF THE INVENTION

The present invention relates to a switchable dividing network for combining at least two signals scanned with a rate or frequency $f_e = f_a/2$ which includes a suitable number of individual filters arranged in parallel to each other whose output signals are combined into a common FDM-output signal with doubled scanning rate or frequency $f_a$. The present invention also relates to a switchable dividing network of odd filter length N for combining at least two complex signals $s_v = s_{rv} + j s_{iv}$, wherein $v=1,2,\ldots$, of scanning rate or frequency $f_e$ to obtain a complex signal of doubled scanning frequency $f_a = 2f_e$.

These types of dividing networks are also used to combine two complex signals into a frequency multiplexed signal (which is briefly named FDM signal in the following) with a doubled scanning frequency $f_a$. These dividing networks are used, for example, in directional radio or in point-to-multipoint connections.

Basically they require a suitable preparation of the combined signals so that the band widths B1 and/or B2 of both signals are limited to a value fe/2, where fe is the scanning frequency of the signals. For this combination it is also required that the sum of both band widths is given by $B1 + B2 \leq f_a/2 = f_e$ and that both useful spectra of the input signals do not overlap. A possible spectral configuration of these signals is shown, for example, in FIG. 9. It is clearly shown that both spectra of the individual signals are inside a range of from 0 to $f_e$. Both individual signals pass through a filter with the same transmission function H, which is indicated for example similarly in FIG. 9.

Also the so-called guard bands $\Delta u$ and $\Delta o$ which are spectrally free, are provided for simplifying (limiting expenses) of the interpolation filtration of the scanning rate increase.

FIG. 10 shows also a known embodiment of a dividing network which has two identical individual filters F1 and F2 with the transmission function H1=H2=H and whose output signals are combined by means of adders.

Because of the comparatively large width of the transmission region the filter must be configured so that it has a comparatively very small transition region and thus also a very small guard band. This leads to a comparatively very high filter expense, determined by the sharpness or steepness of the edge of the bandpass region.

A reduction of the expense may be obtained when both filter functions H1 and H2 are changeable by means of machine-processable stored coefficients. In this case the band width and the central frequency of both filters then agree with the appropriate values of the combined signal spectra. Although the filtration degree and thus the number of filter coefficients is reduced, the preparation of the coefficient statements and the processing and control of the filter requires a substantial expense.

SUMMARY OF THE INVENTION

It is an object of the present invention to provide a switchable dividing network of the above-described type which is more economical and does not suffer from the disadvantages described above.

According to the invention the switchable dividing network for combining at least two signals scanned at an undoubted scanning frequency ($f_e = f_a/2$) includes a corresponding plurality of individual filters arranged parallel to each other and producing respective output signals, wherein the individual filters have an odd filter length and complex coefficients (h(l)) for which l=-(N-1)/2 to (N-1)/2 have alternating purely real and purely imaginary values, complex coefficients for which l=0 being given by formula (2):

$$h(0) = \pm h(0)(1 \pm j)/2 \qquad (2),$$

at least one individual filter is a half-band filter (1) having exclusively real coefficients for which h(l)=h(-l) for all l such that $|l| \leq (N-1)/2$ and for which h(l)=0 for $l = \pm 2, \pm 4, \ldots$, the corresponding plurality of said individual filters being equal to the number of the at least two signals; means for modulating a pulse response of the half-band filter (1) on a complex carrier having at least one carrier frequency given by $f_m = (2m-1)f_a/8$, with $m=0, \pm 1, \pm 2, \ldots$, and $f_a = 1/T$, so that the complex coefficients are given by the formula (1):

$$\underline{h}(l) = h(l) e^{j[l(2m-1)\pi/4 + \varphi_0]} \qquad (1)$$

$$= h(l) e^{j[l(2m-1)+(2k-1)]\pi/4}$$

wherein $m = 0, \pm 1, \pm 2, \ldots$, the complex carrier has a null phase $\varphi_0$ equal to $(2k-1)\pi/4$ with $k = 0, \pm 1, \pm 2, \ldots$; means for combining the output signals of the individual filters to form a common FDM-output signal with a doubled scanning frequency ($f_a$) and means for adjusting at least one means for combining and means for changing a plurality of signs of respective coefficients in at least one individual filter during combination of the output signals.

Because both individual filters are complex half-band filters with a center frequency $f_m = (2m-1)f_a/8$, wherein $f_a$ is the doubled input and/or the simple output scanning rate or frequency and $m = 0, \pm 1, \pm 2, \ldots$, the useful band width of both filters may be halved so that the substantially broader side ranges are omitted. Because of that the filter expense is considerably reduced. Moreover an additional advantage is that the guard bands are no longer required.

An additional advantage is that the transmission function of one filter is convertible into the transmission function of another filter or to another center frequency $f_m$ in a simple way by changing a few signs of certain filter coefficients.

According to another aspect of the invention the invention provides a switchable dividing network of odd filter length N for combining at least two complex signals of the form $s_v = s_{rv} + j s_{iv}$, wherein $v-1, 2, \ldots$, and scanned at an undoubled scanning frequency ($f_e$) to form a complex output signal at a double frequency ($f_a = 2 f_e$). This switchable dividing network comprises a corresponding plurality of partial transmission devices having complex coefficients ($h_m(l)$) and an odd filter length (N), wherein complex coefficients for which l=-(N-1)/2 to (N-1)/2 have alternating purely real and purely imaginary values, complex coefficients for which l=0 are given by formula (2):

$$h_m(0) = \pm h(0)(1 \pm j)/2 \qquad (2);$$

at least one half-band filter (1) having exclusively real coefficients for which h(l)=h(-l) for all l such that $|l| \leq (N-1)/2$ and for which h(l)=0 for $l = \pm 2, \pm 4, \ldots,$ ; means for modulating a pulse response of the at least one half-band filter (1) on a complex carrier of at least one carrier frequency given by $f_m = (2m-1)f_a/8$, with $m = 0, \pm 1, \pm 2, \ldots$ and $f_a = 1/T$, the doubled scanning frequency, so that the coefficients are given by formula (1):

$$\underline{h}_m(l) = h(l)e^{j[l(2m-1)\pi/4+\varphi_0]} \quad (1)$$

$$= h(l)j^k e^{j(l+1)(2m-1)\pi/4}$$

wherein k,m=0,±1,±2, . . . , the complex carrier has a null phase $\phi_0$ equal to (2m−1)π/4+kπ/2 with k=0,±1,±2, . . . ; combining devices associated with at least one partial transmission device; and means for adjusting at least one combining device and means for changing a plurality of signs of respective coefficients in the at least one partial transmission device.

A preferred embodiment of this switchable dividing network also includes a first filter portion and a second filter portion, each of which has a real-part delay circuit branch for real coefficients and an imaginary-part delay circuit branch for imaginary coefficients, means for supplying a sum signal, $s_R$, equal to $s_{r1}$ plus $s_{r2}$, to the real-part delay circuit branch of the first filter portion, means for supplying a difference signal, $d_R$, equal to $s_{r1}$ minus $s_{r2}$, to the imaginary-part delay circuit branch of the first filter portion, means for supplying another difference signal, $d_I$, equal to $s_{i1}$ minus $s_{i2}$, to the imaginary-part delay circuit branch of the second filter portion, means for supplying a sum signal, $s_I$, equal to $s_{i1}$ plus $s_{i2}$, to the real-part delay circuit branch of the second filter portion, and further comprises means for adjusting or setting signs of $s_{r1}$, $s_{r2}$, $s_{i1}$ and $s_{i2}$ used to form differences signals $d_R$ and $d_I$, so that the dividing network is switched by switching the signs.

Because of the features set forth in this other aspect of the invention described above an additional advantage regarding filter expense can be obtained since each individual filter is combined into a dividing network. Also the conversion to the other transmission function may be obtained by a sign change at only two adders.

The switchable dividing networks according to the invention have, in contrast to the prior art, the advantage that the circuitry expense for the switchable dividing network is greatly reduced.

In a particularly preferred embodiment of the invention the individual filters or filter portions have a bandpass located between a pair of center frequencies, and each center frequency of the pair is selected from the group consisting of $f_a/8$, $3f_a/8$, $5f_a/8$ and $7f_a/8$.

In preferred embodiments of the invention the filter portions have partial transmission functions (H1,H2) and the partial transmission functions each have at least partially overlapping passbands. The individual filters or filter portions may comprise an FIR filter. Advantageously coefficients of the filter portions are fixed and may be represented in CSD code (0,1,−1).

BRIEF DESCRIPTION OF THE DRAWING

The objects, features and advantages of the invention will now be illustrated in more detail with the aid of the following description of the preferred embodiments, with reference to the accompanying figures in which:

FIGS. 4a), 4b) and 4c) are spectral diagrams;

FIGS. 5a), 5b) and 5c) are additional spectral diagrams;

FIGS. 6a), 6b) and 6c) are other spectral diagrams;

FIGS. 8a), 8b), 8c) and 8d) are schematic diagrams of possible switching devices;

FIG. 9 is a spectral representation of a dividing network according to the prior art, and FIG. 10 is a schematic representation of a dividing network according to the prior art.

DESCRIPTION OF THE PREFERRED EMBODIMENTS

Figure 1:
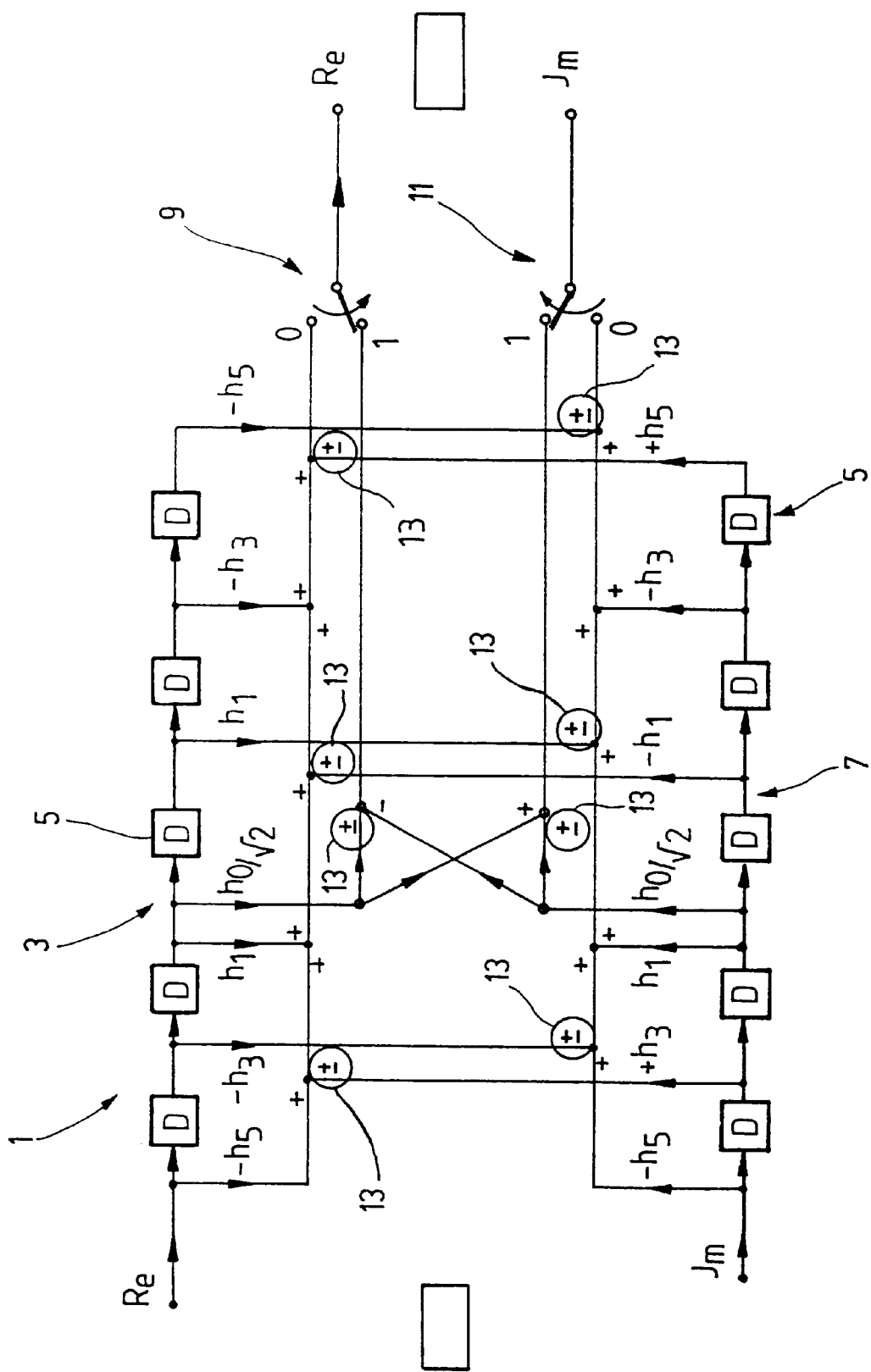
FIG. 1 is a schematic diagram of an individual filter of the dividing network according to the invention.

A complex half-band filter 1 ($H_1$) is shown in FIG. 1, which converts a complex input signal with the scanning rate $f_e=1/(2T)=1/D$ into a complex output signal with the scanning rate $f_a=2f_e=1/T=2/D$. The filter 1 with the odd filter length N=11 includes a first delay circuit branch 3 with (N−1)/2=5 time delay components 5 with a delay time D for the real part of the input signal and a second delay circuit branch 7 with similarly (N−1)/2=5 time delay components 5 for the imaginary part of the input signal.

The signals processed with the filter coefficients h(k) of the delay circuit branches 3,7 are fed to two multiplexers 9,11, which perform a scanning rate doubling to a scanning rate of fa=1/T, when two partial signals are interleaved or combined with each other.

The complex coefficients h(l) of this nonrecursive half-band filter 1 are neither real nor purely imaginary for l not equal to 0, wherein −(N−1)/2≦l≦(N−1)/2. Because of that the coefficients are not complex valued in the usual sense so that an expense reduction, especially in regard to the required multiplier, results. Only the coefficient h(0) is complex according to $$h(0)=\pm(c_0\pm jc_0).$$

The following equation (1) results for the half-band filter by modulation of the pulse response of this filter to a complex carrier of carrier frequency based on a center frequency $f_m=(2m-1)f_a/8$ with reference to the scanning frequency:

$$\underline{h}(l) = h(l)e^{j[2\pi f_{m'} \cdot f_a + \varphi_0]} \quad (1)$$

$$= h(l)e^{j l(2m-1)\pi/4} e^{j\varphi_0}$$

$$= h(l)e^{j[l(2m-1)+(2k-1)]\pi/4},$$

which means that $\phi_0=(2k-1)\pi/4$, wherein k=0,±1,±2, . . . Furthermore because of the linear phase relationships of the filter h(l)=h(−l) and from the half-band filter property h(l)=0 for l=±2,±4,±6, . . .

For l=0 equation (1) above reduces to the following equation (2):

$$\underline{h}(0) = h(0)e^{j(2k-1)\pi/4} \quad (2)$$

$$= h(0)[\cos\{(2k-1)\pi/4\} + j\sin\{(2k-1)\pi/4\}]$$

$$= h(0)[\sin\{(2k+1)\pi/4\} + j\sin\{(2k-1)\pi/4\}]$$

$$= \pm h(0)(1\pm j)/\sqrt{2}$$

Also the sign depends on k=0,±1,±2, . . . , wherein k sets the null phase $\phi_0$.

The following table concerning the filter coefficients results considering the above-described equations and the linear phases of the filters:

TABLE I

| l  | h(l) |
|----|------|
| −5 | −h(−5) = −h(5) = −h$_5$ |
| −3 | −jh(−3) = −jh(3) = −jh$_3$ |
| −1 | h(−1) = h(1) = h$_1$ |
| 0  | h(0)/Γ2 + jh(0)/Γ2 |
| 1  | jh(1) = jh$_1$ |
| 3  | −h(3) = −h$_3$ |
| 5  | −jh(5) = −jh$_5$ |

The Table is prepared for a filter of filter length N=11 and k=m=1 according to $f_1=f_a/8$ as an example.

In FIG. 1 the connection points 13 are illustrated in which two signs are shown. The respective upper signs "+" are for the case m=1 which means a center frequency of $f_1=f_a/8$.

As indicated already in connection with FIG. 10, the dividing network comprises two individual filters F1 and F2 whose output signals s are combined into a common signal. Each of these individual filters F1,F2 is constructed as shown in the embodiment according to FIG. 1. However the center frequencies of the filters can differ by about $\Delta f_m=f_a/4$.

Now if the second filter F2 has a center frequency $f_2=(3/8)f_a$, this filter corresponds to the arrangement shown in FIG. 1 in which however the lower signs "−" in the connection points 13 are used.

Furthermore it is apparent that the device can be switched between the transmission function $H_1$ with a center frequency $f_1=f_a/8$ and the transmission function $H_2$ with a center frequency $f_2=3f_a/8$ by adjustment and/or change of the signs provided in the eight connection points 13.

Spectral diagrams of the frequency network with two parallel filters F1 and F2 are given in FIGS. 4a), 4b) and 4c) and 5a), 5b) and 5c).

Thus the filter F1 with the transmission function $H_1$ has a center frequency $f_a/8$, while the parallel filter F2 has a transmission function $H_2$ with a center frequency $3f_a/8$. Both signals s1 and s2 are filtered so that a signal s3 combined from both individual signals is present at the output of the dividing network.

A very much smaller useful band range is apparent here—in contrast to that shown in FIG. 9 for the prior art—so that a transitional region 15 at the edge of the bandpass can be substantially wider. Furthermore this results in the desired expense reduction of the filter.

If both input signals s1 and s2 are for example in the upper half of the input band, by changing the signs in the connection points 13 the transmission function of the filter may be switched. The transmission function of the filter F1 now corresponds to that of the filter F2 in the example shown in FIGS. 5a) and 5b).

Figure 2:
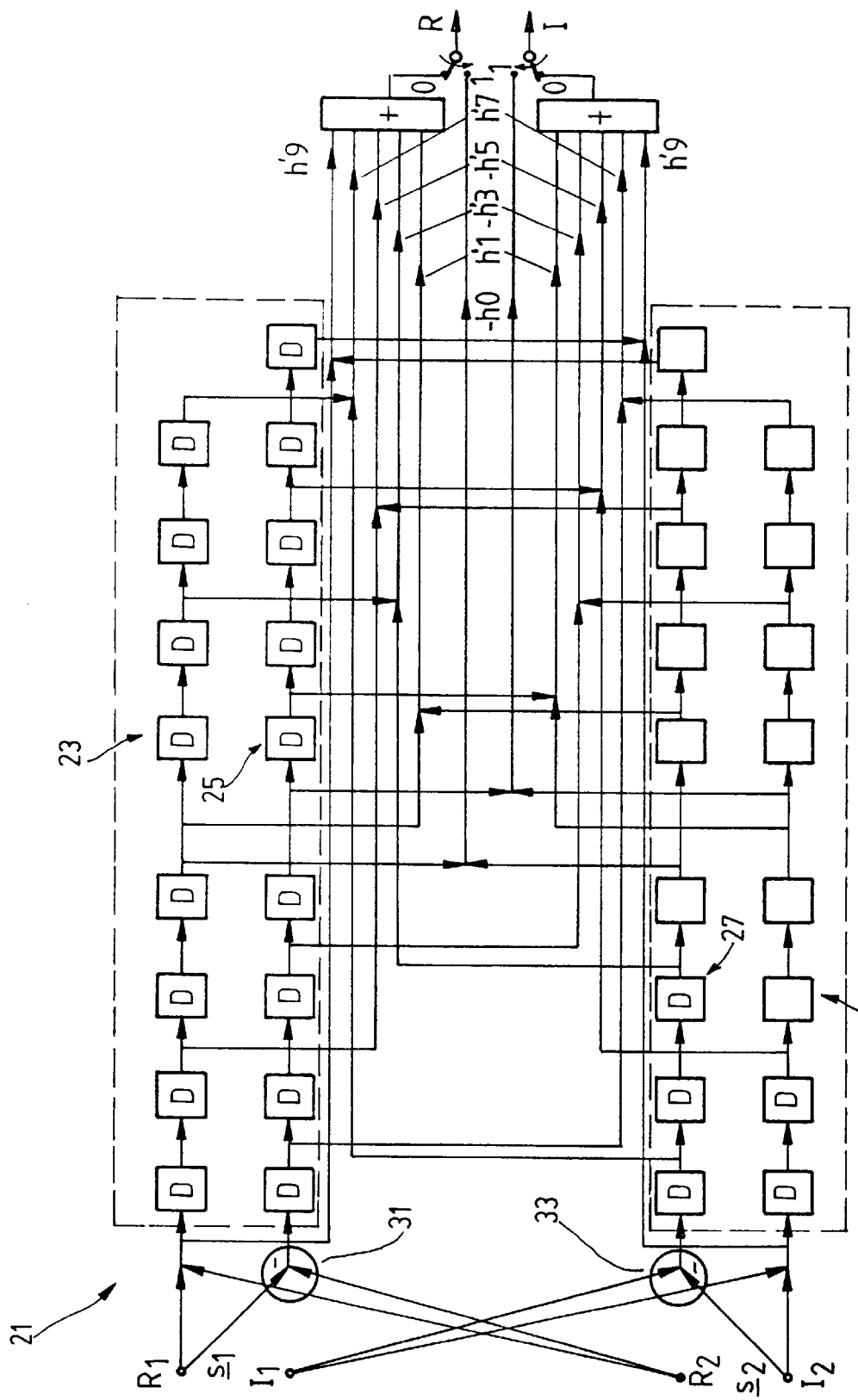
FIG. 2 is a schematic diagram of a dividing network according to a second embodiment of the invention.

Another example of a dividing network is shown in FIG. 2. Two nonrecursive half-band filters as shown in FIG. 1 are connected together. The property that the filter coefficients with different center frequencies differ only in sign according to the above-described equations is used.

In order to clearly understand this the above-described formula is rearranged and the value of the null phase with $$\phi_0=(2m-1)\pi/4+k\pi/2$$

is selected according to m=0,±1,±2, . . . , also according to the position of the center frequency $f_m=(2m-1)f_a/8$ of the partial transmission function. Thus the following formula (3) results for the complex coefficients by substitution of this center frequency relationship in formula (1):

$$\underline{h}_m(l) = h(l)e^{j((2m-1)\pi/4+\varphi_0)} \quad (3)$$

$$= h(l)j^k e^{j(l+1)(2m-1)\pi/4}$$

The dividing network 21 in the present embodiment has a filter length of N=19 and includes four delay circuit branches 23, 24, 27 and 29. Both outer delay circuit branches 23, 29 include respectively (N−3)/2=8 time delay components with a time delay of $D=1/f_e$. The delay circuit branch 23 is supplied with the sum signal of both real parts of the input signal, while the lower delay circuit branch 29 is supplied with the sum signal of both imaginary parts of the input signal.

Both delay circuit branches 25 and 27 include at least one more time delay component so that they have all together (N−1)/2=9 time delay components with a time delay D.

The delay circuit branch 25 is supplied with a signal which is formed in a connection point 31 from both real parts of the input signals. Accordingly both imaginary parts of the input signals are combined in a connection point 33 and fed to the delay circuit branch 27.

Either the transmission function H1 (center frequency $f_1=3f_a/8$) or the transmission function H2 (center frequency $f_2=5f_a/8$) is used for the input signals depending on the coupling performed in these connection points 31,33.

Figure 3D:
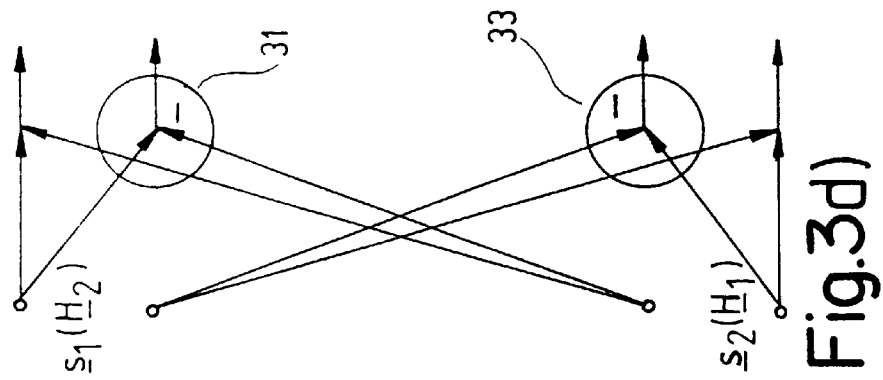
FIGS. 3a), 3b), 3c) and 3d) are schematic diagrams of the switching devices.
Figure 3C:
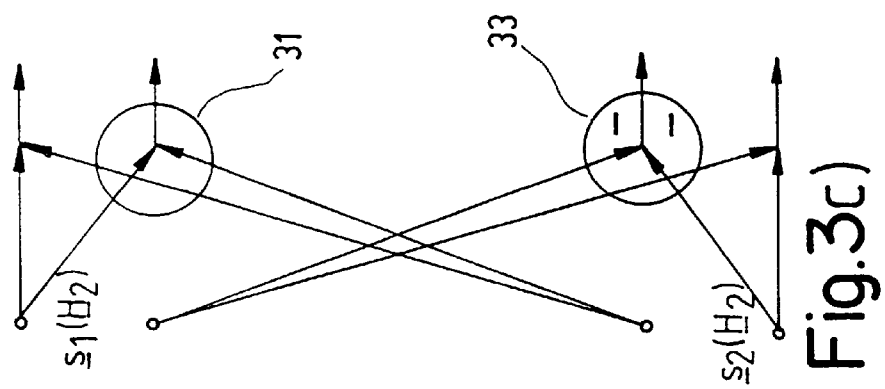
Figure 3B:
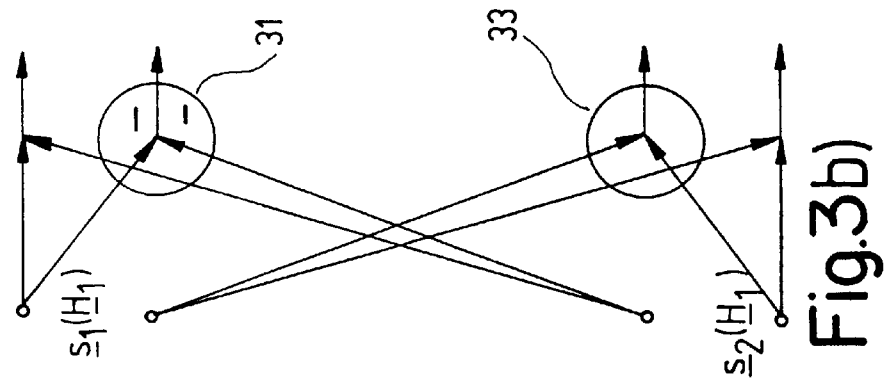
Figure 3A:
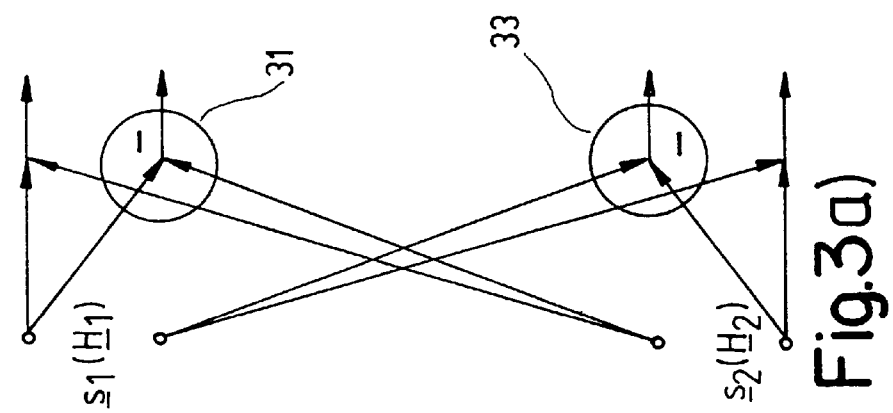

FIGS. 3a), 3b), 3c) and 3d) show four possible combinations of the transmission functions H1 and H2. In the case of the situation shown in FIG. 3a) the transmission function H1 is applied to the signal s1 and the transmission function H2 is applied to the signal s2. With the adjustment of the signs in the connection points 31 and 33 shown in FIG. 3b) the transmission function H1 is used on both input signals, while both transmission functions H2 are used in the case shown in FIG. 3c). The final possibility is illustrated in FIG. 3d) in which the transmission function H2 is associated with the upper input signal and the transmission function H1 is associated with the lower input signal.

These figures clearly show that a switching between the transmission functions H1 and H2 is very simply possible since only the signs are changed in the connection points 31 and 33.

Spectral diagrams for a transmission function H1 with the center frequency $f_1=3f_a/8$ and a transmission function H2 with the center frequency $f_2=5f_a/8$ are shown in FIGS. 6a), 6b) and 6c). The filtering itself occurs here as illustrated in FIGS. 4a), 4b) and 4c) and 5a), 5b) and 5c).

Figure 7:
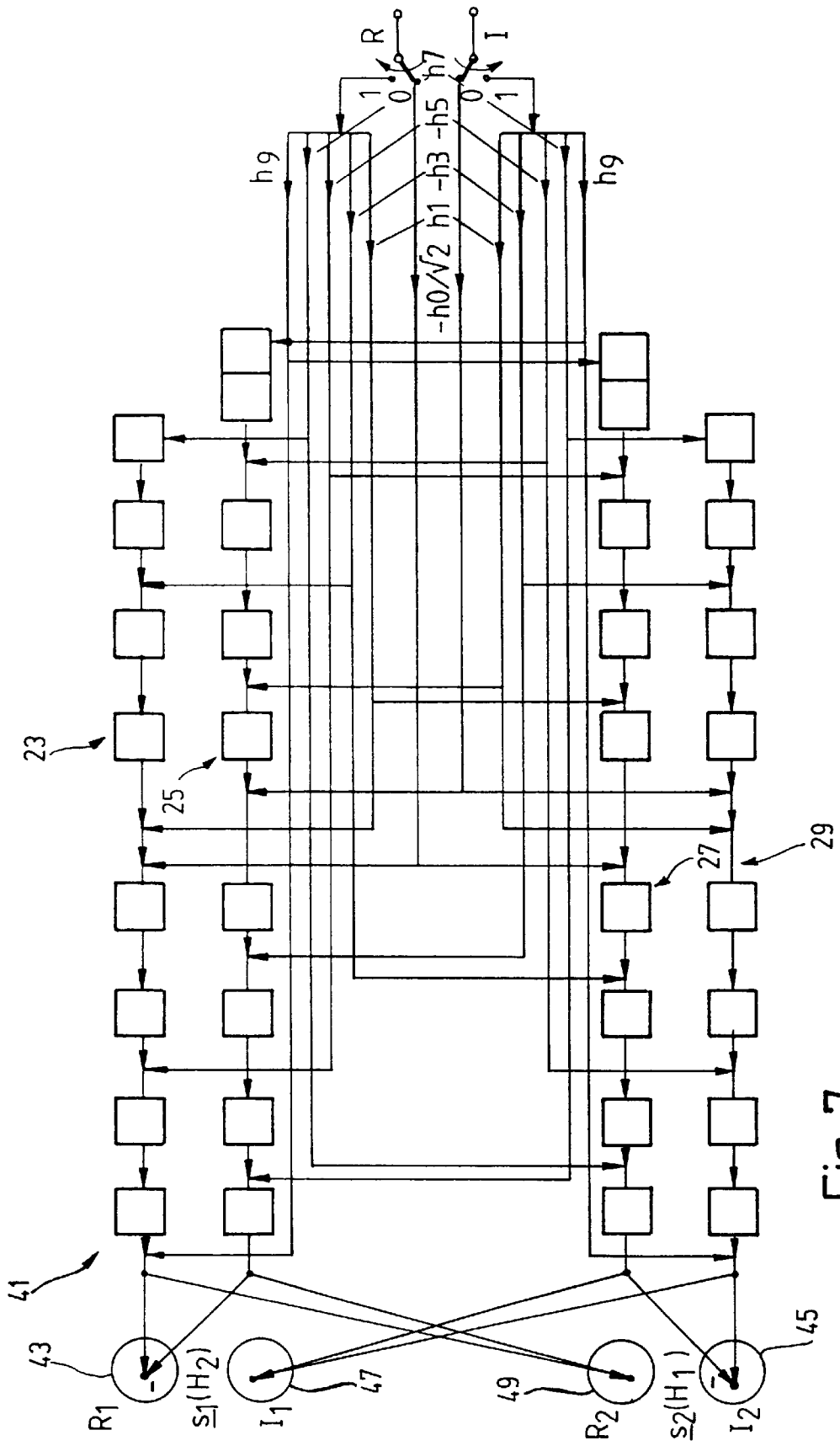
FIG. 7 is a schematic diagram of a demultiplexer for separating signals into two individual signals.

FIG. 7 shows an embodiment of a circuit according to FIG. 2 which acts however to separate a complex signal into two individual signals. The structure of this FDM-demultiplexer results from a systematic transposition of the filter structure according to FIG. 2 in which the number of state memories and the multiplier remain the same. Because of that the transmission function H1 for the upper output terminal pair and the transmission function H2 for the lower output terminal pair result.

The imaginary part of the first signal $s_1$ results from addition of both output signals of the delay circuit branches 27,29. The real part of the second output signal $s_2$ results by addition of both output signals of the upper delay circuit branch 23,25.

The connection of the output signals of both upper delay circuit branches 23,25 to the real part of the first output signal and the second output signal occurs in a connection point 43 and/or a connection point 49. The connection of the output signals of both lower delay circuit branches 27,29 to the imaginary part of the first output signal and the second output signal occurs in a connection point 47 and/or a connection point 45.

Also in this case the transmission function H1 or H2 may be adjusted by selection of the manner of connection of the signals in the connection points 43, 45, 47 and 49. The four possibilities are illustrated in FIGS. 8a), 8b), 8c) and 8d).

Also the transmission function can be changed in a simple way in this demultiplexer circuit so that the filter expense can is reduced.

Understandably different embodiments with changed filter lengths and other center frequencies are possible in addition to those described hereinabove in connection with the drawing figures.

While the invention has been illustrated and described as embodied in a switchable dividing network, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims:

1. A switchable dividing network for combining at least two signals scanned at an undoubted scanning frequency ($f_e = f_a/2$), said dividing network comprising
   a corresponding plurality of individual filters arranged parallel to each other and producing respective output signals, wherein each of said individual filters has complex coefficients (h(l)) and said complex coefficients of ones of said individual filters having an odd filter length (N) for which $l=-(N-1)/2$ to $(N-1)/2$ have alternating purely real and purely imaginary values, ones of said complex coefficients for which $l=0$ are given by formula (2):

$$h(0) = \pm h(0)(1 \pm j)/2 \qquad (2),$$

at least one of said individual filters is a half-band filter (1) having exclusively real coefficients for which $h(l)=h(-l)$ for all l such that $|l| \leq (N-1)/2$ and for which $h(l)=0$ for $l=\pm 2, \pm 4, \ldots$, said corresponding plurality of said individual filters being equal to the number of said at least two signals;
   means for modulating a pulse response of said half-band filter (l) on a complex carrier having at least one carrier frequency given by $f_m = (2m-1)f_a/8$, with $m=0, \pm 1, \pm 2, \ldots$, and $f_a = 1/T$ so that said complex coefficients are given by the formula (1):

$$\underline{h}(l) = h(l)e^{j[l(2m-1)\pi/4 + \varphi_0]} \qquad (1)$$
   $$= h(l)e^{j[l(2m-1)+(2k-1)]\pi/4}$$

wherein $m=0, \pm 1, \pm 2, \ldots$,
   said complex carrier has a null phase $\phi_0$ equal to $(2k-1)\pi/4$ with $k=0, \pm 1, \pm 2, \ldots$;
   means for combining said output signals of said individual filters to form a common FDM-output signal with a doubled scanning frequency ($f_a$); and
   means for adjusting at least one of said means for combining and a plurality of signs of respective ones of said coefficients in at least one of said individual filters during combination of said output signals.

2. The switchable dividing network as defined in claim 1, wherein said individual filters have a passband located between a pair of center frequencies, and each of said center frequencies of said pair is selected from the group consisting of $f_a/8$, $3f_a/8$, $5f_a/8$ and $7f_a/8$.

3. The switchable dividing network as defined in claim 1, wherein each of said individual filters has partial transmission functions (H1,H2) and the partial transmission functions have at least partially overlapping passbands.

4. The switchable dividing network as defined in claim 1, wherein each of said individual filters comprises an FIR filter.

5. The switchable dividing network as defined in claim 1, wherein said coefficients of each of said individual filters are fixed.

6. The switchable dividing network as defined in claim 5, wherein said coefficients are in CSD code representation (0,1,−1).

7. A switchable dividing network of odd filter length N for combining at least two complex signals of the form $s_v = s_{rv} + js_{iv}$, wherein $v=1, 2, \ldots$, and scanned at an undoubled scanning frequency ($f_e$) to form a complex output signal at a double frequency ($f_a = 2f_e$), said dividing network comprising
   a corresponding plurality of partial transmission devices having complex coefficients ($h_m(l)$) and an odd filter length (N), wherein ones of said complex coefficients for which $l=-(N-1)/2$ to $(N-1)/2$ have alternating purely real and purely imaginary values, said complex coefficients for which $l=0$ are given by formula (2):

$$h_m(0) = \pm h(0)(1 \pm j)/2 \qquad (2),$$

at least one half-band filter (1) having exclusively real coefficients for which $h(l)=h(-l)$ for all l such that $|l| \leq (N-1)/2$ and for which $h(l)=0$ for $l=\pm 2, \pm 4, \ldots,$;
   means for modulating a pulse response of said at least one half-band filter (1) on a complex carrier of at least one carrier frequency given by $f_m = (2m-1)f_a/8$, with $m=0, \pm 1, \pm 2, \ldots$ and $f_a = 1/T$, said doubled scanning frequency, so that $$\underline{h}_m(l) = h(l)e^{j[l(2m-1)\pi/4 + \varphi_0]} \qquad (1)$$
   $$= h(l)j^k e^{j(l+1)(2m-1)\pi/4}$$

wherein $k,m = 0, \pm 1, \pm 2, \ldots$,
   said complex carrier has a null phase $\phi_0$ equal to $(2m-1)\pi/4 + k\pi/2$ with $k=0, \pm 1, \pm 2, \ldots$;
   combining devices associated with at least one of said partial transmission devices; and
   means for adjusting at least one of said combining devices and means for changing a plurality of signs of respective ones of said coefficients in said at least one partial transmission device.

8. The switchable dividing network as defined in claim 7, further comprising a first filter portion and a second filter portion, and wherein each of said first filter portion and said second filter portion has a real-part delay circuit branch (23,29) for real ones of said coefficients and an imaginary-part delay circuit branch (25,27) for imaginary ones of said coefficients, means for supplying a sum signal, $s_R$, equal to said $s_{r1}$ plus said $s_{r2}$, to said real-part delay circuit branch (23) of said first filter portion (11), means for supplying a difference signal, $d_R$, equal to said $s_{r1}$ minus said $s_{r2}$, to said imaginary-part delay circuit branch (25) of said first filter portion (7), means for supplying another difference signal, $d_I$, equal to said $s_{i1}$ minus said $s_{i2}$, to said imaginary-part delay circuit branch (27) of said second filter portion (9), means for supplying a sum signal, $s_I$, equal to said $s_{i1}$ plus said $s_{i2}$, to said real-part delay circuit branch (29) of said second filter portion (9), and further comprising means for adjusting or setting signs of respective ones of said $s_{r1}$, said $s_{r2}$, said $s_{i1}$ and said $s_{i2}$ used to form said differences signals $d_R$ and $d_I$, so that said dividing network is switched by switching said signs.

9. The switchable dividing network as defined in claim 8, wherein said filter portions have a bandpass located between
  a pair of center frequencies, and each of said center frequencies of said pair is selected from the group consisting of $f_a/8$, $3f_a/8$, $5f_a/8$ and $7f_a/8$.

10. The switchable dividing network as defined in claim 8, wherein said filter portions have partial transmission functions (H1,H2) and the partial transmission functions each have at least partially overlapping passbands.

11. The switchable dividing network as defined in claim 8, wherein each of said filter portions comprise an FIR filter.

12. The switchable dividing network as defined in claim 8, wherein said coefficients of said filter portions are fixed.

13. The switchable dividing network as defined in claim 12, wherein said coefficients are in CSD code representation (0,1,−1).

14. A transposing device for separating a complex FDM signal into at least two complex signal parts, said transposing device comprising a switchable dividing network; wherein said switchable dividing network comprises a corresponding plurality of individual filters arranged parallel to each other and producing respective output signals, wherein each of said individual filters has complex coefficients (h(l)) and said complex coefficients of ones of said individual filters having an odd filter length (N) for which l=−(N−1)/2 to (N−1)/2 have alternating purely real and purely imaginary values, ones of said complex coefficients for which l=0 are given by the formula (2):

$$h(0) = \pm h(0)(1 \pm j)/2 \qquad (2)$$

at least one of said individual filters is a half-band filter (1) having exclusively real coefficients for which h(l)=h(−l) for all l such that $|l| \leq (N-1)/2$ and for which h(l)=0 for l=±2,±4, ..., said corresponding plurality of said individual filters being equal to the number of said at least two signals;

means for modulating a pulse response of said half-band filter (1) on a complex carrier having at least one carrier frequency given by $f_m = (2m-1)f_a/8$, with m=0,±1,±2, ..., and $f_a = 1/T$ so that said complex coefficients are given by the formula (1):

$$\underline{h}(l) = h(l)e^{j[l(2m-1)\pi/4 + \varphi_0]} \qquad (1)$$
$$= h(l)e^{j[l(2m-1) + (2k-1)]\pi/4}$$

wherein m=0,±1,±2, ..., said complex carrier has a null phase $\varphi_0$ equal to $(2k-1)\pi/4$ with k=0, ±1,±2, ... ;

means for combining said output signals of said individual filters to form a common FDM-output signal with a doubled scanning frequency ($f_a$); and means for adjusting at least one of said means for combining and a plurality of signs of respective ones of said coefficients in at least one of said individual filters during combination of said output signals.

* * * * *